PHASE CONTROLLED OSCILLATOR LOOP INCLUDING
AN ELECTRONIC COUNTER

Filed Oct. 14, 1965

INVENTOR
CARL-ERIK GRANQVIST
BY Larson and Taylor
ATTORNEYS 3,344,361
Patented Sept. 26, 1967

3,344,361

PHASE CONTROLLED OSCILLATOR LOOP INCLUDING AN ELECTRONIC COUNTER

Carl-Erik Granqvist, Lidingo, Sweden, assignor to AGA Aktiebolag, Lidingo, Sweden, a corporation of Sweden
Filed Oct. 14, 1965, Ser. No. 495,917
Claims priority, application Sweden, Oct. 28, 1964, 12,966/64
3 Claims. (Cl. 331—18)

ABSTRACT OF THE DISCLOSURE

An arrangement for controlling the frequency of operation of a variable frequency generator in which output pulses from the generator are applied to an electric counter directly and via a frequency transformer, alternatively, in dependence on output pulses from the counter and from a coincidence circuit connected to the counter, and in which the output pulse frequency from the counter is compared with a reference frequency in a phase detector and the output from the phase detector controls the frequency of the variable frequency generator.

Figure 1:
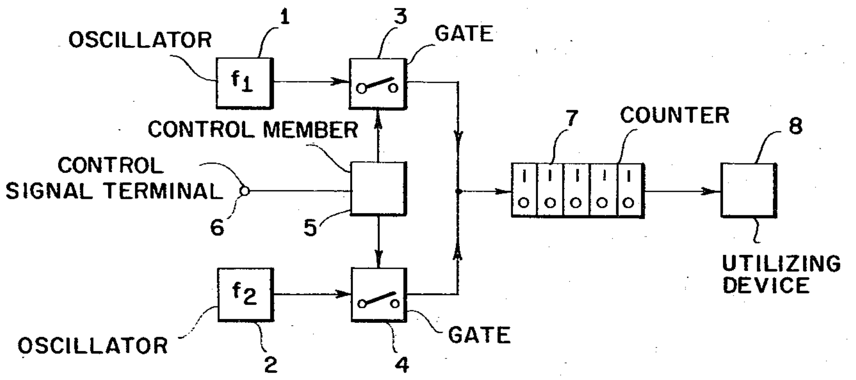

The present invention relates to an arrangement in an electronic counter which is to be used as a time reference, the operation being based on the fact that the time required for feeding a predetermined number of pulses from a pulse sequence of known frequency represents a certain time interval. By way of example, possible applications for such an electronic counter are: ascertaining the lapse of time between transmitted and received radiation in distance measuring, controlling the oscillator frequency of radio receivers for reception of one of a great number of communication channels, or in transmitters or other instruments comprising oscillators having a great number of fixed frequencies which are to be maintained with great precision. Further possible applications of an electronic counter according to the invention are obvious to one skilled in the art, and there will therefore be described below only the application of the invention in which the counter is used for controlling the frequency of an oscillator.

It has already been proposed to use an electronic counter for controlling an oscillator, the arrangement being such as to count during a certain time interval the number of oscillations from an oscillator, whereupon the oscillator frequency was corrected if the number of oscillations during the interval was too large or too small. To this end, the oscillator was connected to an electronic counter operating as a frequency divider so as to divide the oscillator frequency with a certain number. The output from the electronic counter was then applied to a detector, in which a comparison was made with the signal from a reference oscillator. The detector output was then made to influence the oscillator frequency via a low pass filter, the oscillator element influenced by the detector output being for instance a capacitance diode.

If the oscillator frequency is designated $f_o$ and the frequency of the reference oscillator is $f_r$ and it is assumed that the electronic counter operates as a frequency divider with the ratio $1/n$, the following relation exists between the oscillator frequency and the reference frequency:

$$f_o = n \cdot f_r \quad (1)$$

This known system is very simple as such. However, there are great difficulties in making the electronic counter operate sufficiently rapidly. This is chiefly due to the fact that after each counting of oscillations into the counter, that is after each output pulse delivered by the counter, it must be reset to 0 or a certain number must be programmed into it.

These difficulties are obviated through the application of the present invention by arranging for an adjustable number of pulses from a pulse sequence of fixed frequency to be counted into the counter, whereupon pulses from a pulse sequence of different frequency are adapted to be counted into the counter to a number equal to the difference between the total capacity of the counter and the number of pulses fed into it of the firstmentioned frequency. By adjustment of the adjustable number of pulses from the firstmentioned sequence it is then possible to change in a simple manner the time for counting a certain number of pluses into the counter.

Figure 2:
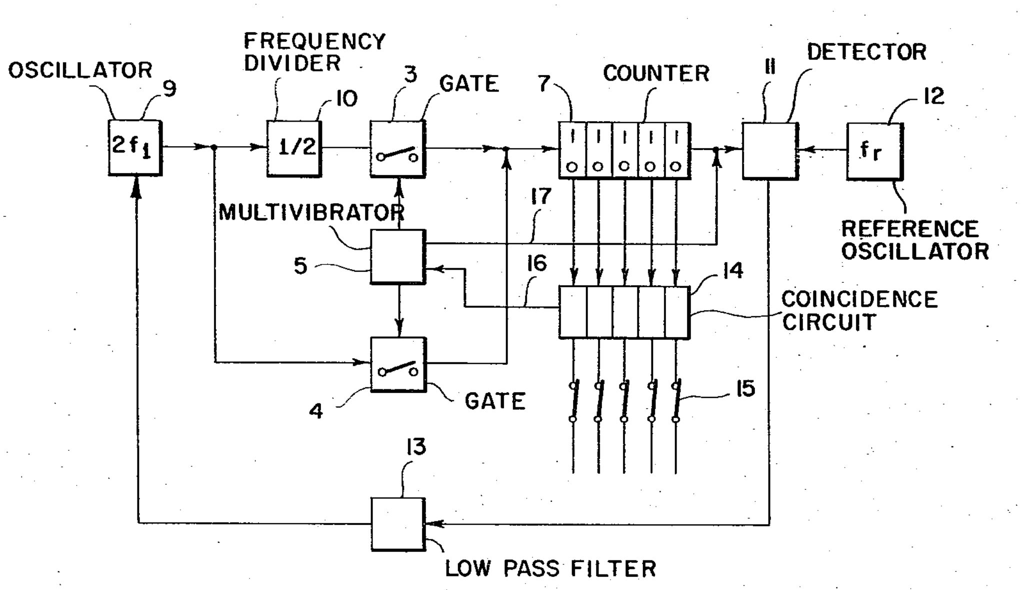

The invention is described below with reference to the attached drawing, FIG. 1 of which illustrates the general idea of the invention and FIG. 2 showing the application of the invention to an arrangement for controlling the frequency of an oscillator.

In FIG. 1, an oscillator 1 is arranged to generate a sequence of pulses of frequency $f_1$ and a second oscillator 2 to generate a pulse sequence of frequency $f_2$. Each one of these pulse sequences may comprises for instance half-periods of equal polarity of an alternating voltage.

Connected to the oscillator 1 is an electronic gate 3 and to the oscillator 2 a second electronic gate 4. These gates are controlled by a control member 5, whereby at each instant only one gate is conductive. A control signal is applied to the control member 5 via a terminal 6. The pulses of the various pulse sequences that pass through the corresponding gates are applied to an electronic counter 7, which may be of the usual binary type and is assumed in the embodiment to comprise five stages. This implies that the counter capacity is exhausted when 32 pulses have been counted in and the counter then returns to the starting position. Connected to the counter 7 is finally a device 8 for utilizing the output pulses from the counter. As stated above, the counter may be used as a time reference, the utilizing device being then designed to indicate the time interval between a pair of subsequent output pulses from the counter 7. Other embodiments of utilizing device 8 will be apparent from the following description.

If it is assumed that the counter capacity is $n_0$ pulses and that the gates 3 and 4 are controlled in such a way that $n_1$ pulses of frequency $f_1$ are first applied to the counter, whereupon the gates are adjusted in such a way that pulses of frequency $f_2$ are applied to the counter until its capacity is exhausted, the time of a counting period will be $$t = \frac{n_1}{f_1} + \frac{n_0 - n_1}{f_2} \quad (2)$$

In the special case that the pulse frequency of oscillator 2 is twice the pulse frequency generated by oscillator 1, this expression becomes $$t = \frac{n_0 + n_1}{2f_1} \quad (3)$$

This means that the counter delivers a pulse sequence of a frequency $f$ $$f = \frac{2f_1}{n_0 + n_1} \quad (4)$$

It is apparent from this expression that with a counter of given capacity $n_0$ and with given frequencies of the pulse sequences delivered from the oscillators 1 and 2, the frequency of the output pulse sequence of the counter 7 can be varied in a simple manner between the limits $$f_{max.} = \frac{2f_1}{n_0}$$

(if $n_1=0$) and $$f_{min.}=\frac{2f_1}{2n_0}$$

(if $n_1=n_0$).

In the FIG. 2 embodiment, the electronic counter of the invention is used for controlling the frequency of an oscillator. By changing the number of pulses of different frequencies fed into the counter and by comparing with a fixed reference frequency the oscillator frequency can be adjusted to certain given values.

The oscillator designated 9 in FIG. 2 is assumed to generate an alternating voltage or, alternatively, a pulse frequency of frequency $2f_1$ in the manner indicated above. This frequency is applied on the one hand direct to an electronic gate 4 and on the other hand through a frequency divider 10 with the dividing ration 1/2 to the gate 3. As in the FIG. 1 arrangement, the two gates 3 and 4 are controlled by a control member 5 represented in the present instance by a multivibrator, which in its turn is controlled in a manner to be described below.

The pulses passing through the gates 3 and 4 are applied to the electronic counter 7. The pulse sequence delivered from the counter is applied to a phase detector 11, where a comparison takes place with the frequency of an alternating frequency generated by a reference oscillator 12. The output from the detector 11 is applied via a low pass filter 13 to an arrangement for controlling the frequency of the oscillator 9. This arrangement may for instance consist of a capacitance diode in well-known manner.

As is apparent from the above, the gates 3 and 4 are to be controlled by the multivibrator 5 so as to make pulses of the frequency $f_1$ pass through the gate 3 up to a number of $n_1$, whereupon the gate 4 is opened and pulses of the frequency $2f_1$ pass through the gate 4 to the counter 7 until it is filled up, i.e. until $n_0$ pulses have arrived to the counter 7. To make possible this switching over from one to the other of the gates 3 and 4, the counter 7 is connected to a coincidence circuit 14 of a construction which is well-known within the field of data processing. The coincidence circuit is set by suitable operation of one or more switches 15 to a digital number corresponding to the number $n_1$ of pulses of frequency $f_1$ that is to be applied to the counter 7. When therefore this number of pulses has been fed to the counter 7, it has at that particular instant the same setting as the coincidence circuit 14, so that a pulse is delivered from the coincidence circuit 14 and is applied via a conductor 16 to the multivibrator 5, causing a switching over from the gate 3 to the gate 4. The multivibrator 5 is also connected via a second input 17 to the last stage of the counter 7, whereby, when the total number $n_0$ of pulses have been counted in by the counter 7 there occurs again a switching over from the gate 4 to the gate 3. This sequence is then repeated periodically.

It is apparent from the above that the number $n_1$ of pulses of one of the pulse frequencies applied to the counter can be changed in a simple manner through a corresponding closing or opening of the switches 15. This then causes simultaneously through the detector 11 and the low pass filter 13 a corresponding change in the output frequency of the oscillator 9.

If in the FIG. 2 arrangement the frequency of the alternating voltage obtained from the reference oscillator is designated $f_r$, the frequency of the oscillator 9 under the influence of the control voltage produced by the phase detector 11 will adjust itself to a value according to the equation $$f_9=2f_1=(n_0+n_1) \qquad (5)$$

If a suitable rearrangement of the switches 15 is made to change the setting of the coincidence circuit 14 in such a manner that the number of pulses $n_1$ counted into the counter 7 at the pulse frequency $f_1$ is changed from $n_1=0$ to $n_1=n_0$, then the frequency of the oscillator 9 will vary in steps of $f_r$ from a minimum frequency $f_{9\ min.}=f_r \cdot n_0$ to a maximum frequency of $f_{9\ max.}=f_r \cdot 2n_0$. As a practical embodiment, the frequency of the reference oscillator may be assumed to be $f_r=50$ kHz. and the capacity of the counter 7 to be $n_0=256$ pulses. The frequency of the oscillator 9 will thus vary from the minimum value of 12.8 MHz to the maximum value of 25.6 MHz. in 256 steps of 50 kHz. each. This may also be expressed by saying that the oscillator 9 can be adjusted to 256 different channels with a mutual distance of 50 kHz. between the channels.

There has been described above an embodiment of the invention, however, it is obvious to a person skilled in the art that various modifications thereof are possible within the scope of the following claims. For instance, instead of a frequency halving performed in the frequency divider 10, a frequency doubling may be performed with one of the pulse sequences. Such a frequency doubling can be obtained in known manner by transforming the output from the oscillator 9 into square pulses and differentiating the pulses so as to obtain positive pulses interspersed with negative pulses. The double pulse frequency can then be obtained through a phase reversal of the negative pulses which are then after the moment of coincidence applied to the counter together with the positive pulses.

It is also possible to replace the coincidence circuit 14 and its switches 15 with a device based on the application of known digital analogue transformation of data processing for generating voltages or currents which are proportional to a digital number to which the device has been set. These voltages or currents are then compared with voltages or currents, respectively, generated in a corresponding manner by the counter 7, whereupon the multivibrator is actuated by the differential current obtained.

It is apparent too, that instead of counting pulses of double frequency into the counter 7 after the moment of coincidence, it is possible to count in after the moment of coincidence a lower pulse frequency to the full capacity of the counter, such as the half frequency, whereby another range of variation for the frequency of the oscillator 9 is obtained.

What I claim is:

1. An arrangement for controlling the frequency of operation of a variable frequency generator by reference to a reference generator with fixed frequency, comprising an electronic counter having a fixed total capacity connected to a coincidence circuit, and means for setting the coincidence circuit, a frequency transformer connected to the output of the variable frequency generator, means for alternatively applying the output of the variable frequency generator and the frequency transformer to the counter comprising electronic gates and a control circuit for controlling the gates and means for alternatively applying output triggering pulses from the counter and from the coincidence circuit to the control circuit, a phase detector, means for applying the output pulses from the counter and the output from the reference generator to the detector and means for applying the output from the phase detector to the variable frequency generator to control the frequency thereof.

2. An arrangement for controlling the frequency of operation of a variable frequency generator by reference to a reference generator with fixed frequency, comprising an electronic counter having a fixed total capacity connected to a coincidence circuit, and means for setting the coincidence circuit, a frequency transformer connected to the output of the variable frequency generator, means for alternatively applying the output of the variable frequency generator and the frequency transformer to the counter comprising electronic gates and a control circuit for controlling the gates and means for alternatively applying output triggering pulses from the counter and from the coincidence circuit triggering the control circuit to apply the output from the variable frequency generator to the counter and the output pulses from the counter triggering the control circuit to apply the output from the frequency transformer to the counter, a phase detector, means for applying the output pulses from the counter and the output from the reference generator to the detector and means for applying the output from the phase detector to the variable frequency generator to control the frequency thereof.

3. Apparatus for controlling the frequency of operation of a variable frequency oscillator comprising a variable frequency oscillator for producing a continuous pulse sequence of a first frequency, a frequency transformer for producing a continuous pulse sequence of a second frequency connected to the output of the variable frequency oscillator, an electronic counter having a certain total pulse capacity, control means comprising an adjustable coincidence circuit connected to the counter for allowing a given number of pulses of the first frequency to be counted into the counter, thereupon switching to allow pulses of the second frequency to be counted into the counter until the total pulse capacity of the counter is reached, the arrangement being such that upon reaching its total pulse capacity the counter turns to zero and emits an output pulse, the frequency in the output pulses from the counter being compared with a reference frequency and the difference used to adjust the frequency of the oscillator so as to minimize this difference.

References Cited

UNITED STATES PATENTS

| | | | |
|---|---|---|---|
| 2,521,789 | 9/1950 | Grosdoff | 331—18 |
| 3,259,851 | 7/1966 | Brauer | 331—18 X |
| 3,271,588 | 9/1966 | Minc | 307—88.5 |

ROY LAKE, *Primary Examiner.*

S. H. GRIMM, *Assistant Examiner.*